United States Patent [19]
Loya

[11] 3,955,270
[45] May 11, 1976

[54] METHODS FOR MAKING SEMICONDUCTOR DEVICES

[75] Inventor: Andrew Loya, Irvington, N.J.

[73] Assignee: Bell Telephone Laboratories, Incorporated, Murray Hill, N.J.

[22] Filed: Nov. 15, 1974

[21] Appl. No.: 524,059

Related U.S. Application Data

[62] Division of Ser. No. 393,596, Aug. 31, 1973, Pat. No. 3,863,333.

[52] U.S. Cl................................... 29/580; 29/591
[51] Int. Cl.².......................................... B01J 17/00
[58] Field of Search...................... 29/580, 583, 591

[56]  References Cited
UNITED STATES PATENTS

| | | | |
|---|---|---|---|
| 3,069,297 | 12/1962 | Beale | 29/580 |
| 3,689,993 | 9/1972 | Tolar | 29/580 |
| 3,795,045 | 3/1974 | Dumas | 29/580 |

*Primary Examiner*—W. Tupman
*Attorney, Agent, or Firm*—R. B. Anderson

[57]  ABSTRACT

Ultrasonic agitation in a liquid is used in two ways in the fabrication of small semiconductor diodes. First, a silicon-containing metal layer such as platinum-silicide is removed by exposing it to a silicon etchant and then ultrasonically agitating it. Second, an array of diodes connected by a gold film back contact is separated into individual devices by ultrasonically agitating the array to break up the gold film.

5 Claims, 7 Drawing Figures

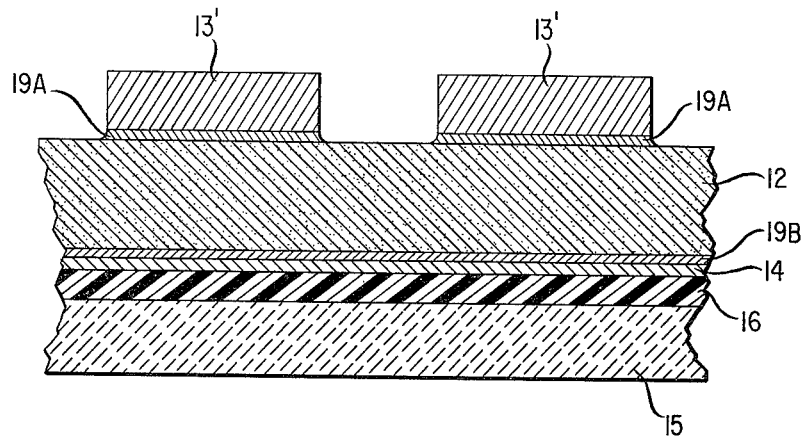
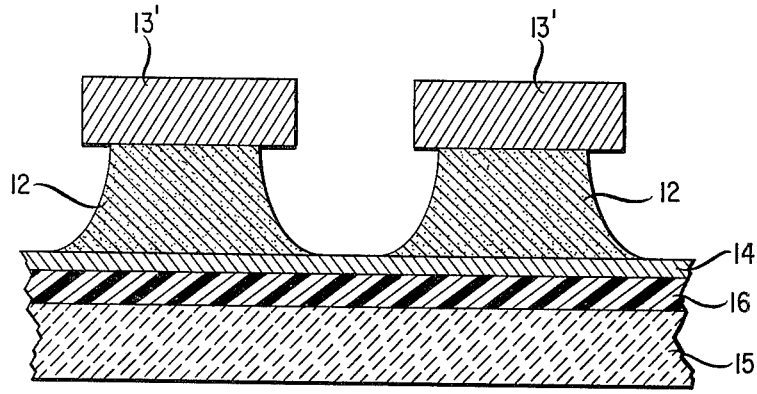
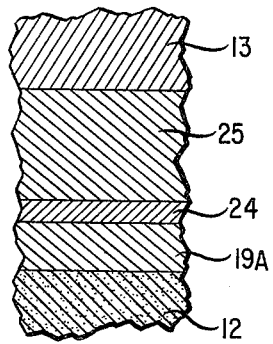
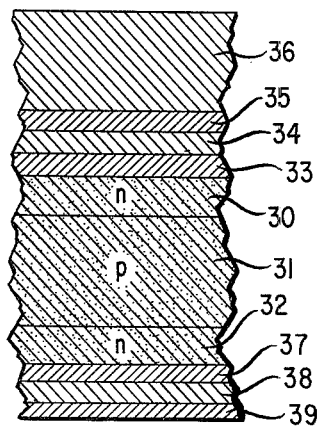

METHODS FOR MAKING SEMICONDUCTOR DEVICES

CROSS REFERENCE TO RELATED APPLICATION

This application is a division of my copending application, Ser. No. 393,596, filed Aug. 31, 1973 now U.S. Pat. No. 3,863,333, issued on Feb. 4, 1975.

BACKGROUND OF THE INVENTION

This invention relates to methods for making semiconductor devices, and more particularly, to methods for making physically small microwave devices such as IMPATT diodes and BARITT diodes.

The IMPATT diode, a device primarily used for generating microwaves, is described, for example, in the U.S. patent of B. C. De Loach, Jr. and R. L. Johnston U.S. Pat. No. 3,270,293, assigned to Bell Telephone Laboratories, Incorporated and the paper "The IMPATT — a Solid-State Microwave Generator," Bell Laboratories Record. K. D. Smith, Volume 45, 1967, page 144. An analogous device operating on the same general principle is described in the U.S. Pat. No. to Read 2,899,652, assigned to Bell Telephone Laboratories, Incorporated. A device that operates in a manner comparable to the IMPATT diode but which has better noise characteristics and is better adapted to microwave amplification is described in the U.S. Pat. No. of D. J. Coleman and S. M. Sze 3,673,514, assigned to Bell Telephone Laboratories, Incorporated, and is now commonly known as the "BARITT" diode, an acronym for Barrier Injection and Transit Time.

Both BARITT and IMPATT devices typically comprise a small silicon chip having a gold "front contact" on one side and a gold "back contact" on the other side. Good electrical characteristics and adherence are typically obtained by including a silicon-containing metal layer such as platinum-silicide between each of the gold contacts and the silicon chip.

These devices are typically very small, and as the intended frequency of operation increases, the physical device size decreases and fabrication tolerances become more stringent. Thus, sophisticated photolithographic masking and etching techniques are used to make a plurality of devices from a single silicon wafer coated with gold on opposite sides. A gold etchant may be used to cut through the gold front contact, a silicon etchant to cut through the wafer, and a second gold etchant to cut through the back contact. Several problems, however, have been encountered. First, it is difficult to remove by etching the silicon-containing metal layer (such as platinum-silicide) without seriously undercutting the gold front contact. Alternative methods for removing the platinum-silicide such as liquid honing produce other undesirable effects. For example, in liquid honing, a stream of abrasive liquid is directed at the front contact to erode away the platinum-silicide and the silicon, using the gold front contact as a mask. This technique, however, tends undesirably to bend and distort the front contacts.

After the silicon wafer has been etched, it is difficult to etch the gold back contact from the side opposite the silicon wafer since this requires precisely registered photolithographic masking, and with such small devices, accurate registration is difficult.

Other conventional techniques for separating the devices from a common wafer such as "dicing" by sawing or other cutting techniques are not sufficiently delicate or sophsiticated to form the extremely small devices desired with the required accuracy. The microwave frequency IMPATT and BARITT diodes contemplated by the present invention typically have diameters of less than 10 mils and thicknesses of typically less than 40 micrometers. BARITT diodes may have a diameter of less than 2 mils with a thickness of only 15 micrometers.

SUMMARY OF THE INVENTION

The foregoing problems are overcome by a method for fabricating semiconductor devices in accordance with an illustrative embodiment of the invention in which the gold front contact is made of sufficient thickness to provide mechanical support, while the back contact is a gold film of less than about 1 micrometer in thickness. After appropriate masking, the front contact is etched in the usual manner to expose a platinum-silicide intermediate layer.

In accordance with one feature of the invention, the platinum-silicide layer is structurally weakened by exposing it to a silicon etchant, which, as can be shown, produces "pin holes" and other structural defects throughout the layer. The entire structure is then immersed in liquid in a conventional ultrasonic generator tank, and subjected to an ultrasonic agitation of sufficient intensity to break away and clean the damaged platinum-silicide layer, thereby exposing the silicon wafer. Next, the silicon is etched through to the back contact using the gold front contact as a mask. With the platinum-silicide having been successfully removed, this etch through can be accomplished without significant deleterious undercutting of the gold front contacts.

Thereafter, the entire array, being held together by the thin film back contact layer, is again placed in the ultrasonic generator tank and again subjected to ultrasonic agitation. In accordance with another feature of this invention, such agitation ruptures the thin film at all locations at which it separates individual devices, thereby leaving completely separated individual devices which are suitable for use as is known in the art.

These and other objects, features and advantages of the invention will be better understood from a consideration of the following detailed description taken in conjunction with the accompanying drawing.

DRAWING DESCRIPTION

FIG. 4 is a schematic view of the wafer of FIGS. 1 and 2 at a subsequent stage of fabrication;

FIG. 5 is a schematic view of the wafer of FIGS. 1, 2 and 4 at a subsequent stage of fabrication;

FIG. 6 is a schematic view of various metal layers used as the metal contact of the wafer of FIGS. 1 and 2; and FIG. 7 is a schematic view of part of another wafer illustrating another embodiment of the invention.

DETAILED DESCRIPTION

Figure 1:
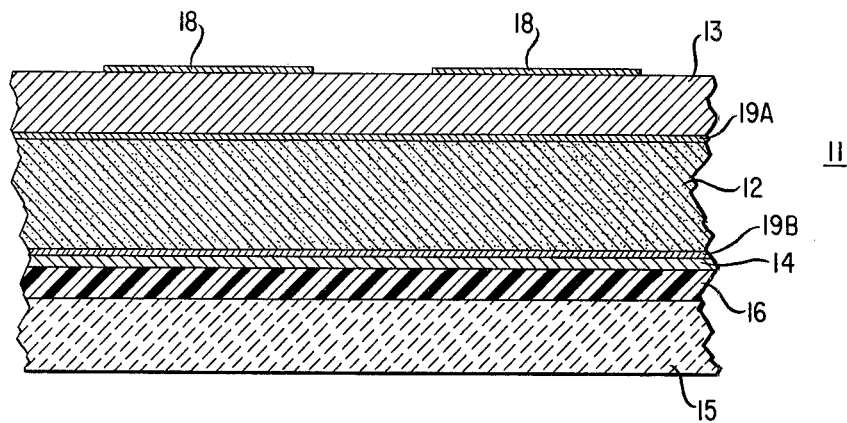
FIG. 1 is a schematic sectional view of a portion of a wafer from which it is intended to fabricate a plurality of BARITT diodes.

Referring now to FIG. 1 there is shown a wafer 11 comprising a silicon semiconductor member 12 coated on opposite sides with a gold front contact layer 13 and a gold back contact layer 14. The structure of the interface between the contact layers and the semiconductor is rather complicated and will be explained in more detail later; but for now suffice it to say that silicon-containing metal layers 19A and 19B, which may be platinum-silicide, are included between the silicon and gold contacts for providing dependable adherence and proper electrical characteristics. The wafer is mounted on a ceramic disc 15 by a layer of wax 16. The purpose of this illustrative embodiment of the invention is successfully to cut the wafer into a plurality of BARITT diodes each having separate front and back contacts. In accordance with known photolithographic techniques, a first step in doing this is to form, by conventional photolithographic exposure and etching, individual layers 18 of photoresist material on one surface of front contact layer 13 which define the devices to be made.

Figure 2:
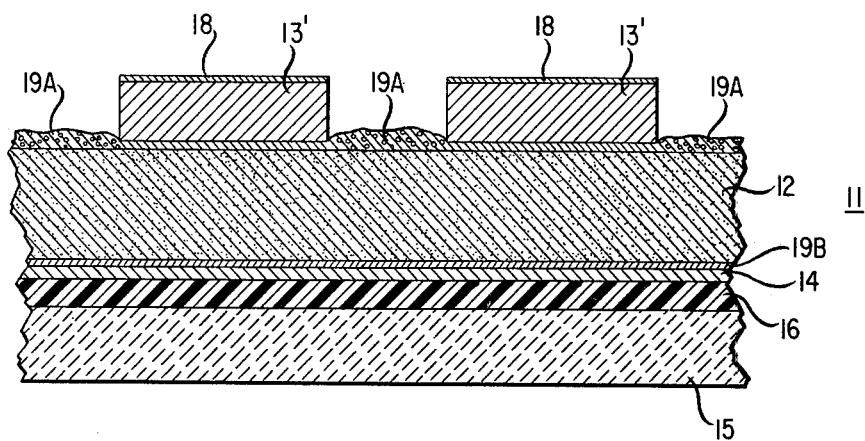
FIG. 2 illustrates the wafer of FIG. 1 in a subsequent stage of fabrication.

Referring to FIG. 2, individual front contacts 13' of the devices to be made are formed in a conventional manner by exposing the masked gold layer 13 to a gold etchant such as an appropriate potassium iodide solution which etches the unmasked portion as shown. This, in turn, exposes the thin platinum-silicide layer 19A as shown, and one problem with which the invention is concerned is that of removing the exposed layer 19A without deleteriously damaging the wafer 12 or undercutting such as by significantly undercutting the contacts 13'. In accordance with one feature of the invention, the exposed layer 19A is subjected to a silicon etch for a period of time which is sufficient to weaken the layer 19A but not for a sufficient time to penetrate through it so as to etch the wafer 12 or undercut contacts 13'. This may be done, for example, by immersing exposed layer 19A in a 20:1 solution of $HNO_3$:HF for approximately one minute. The etch rate of this solution on pure silicon is approximately 4 micrometers per minute. Assuming that the platinum silicide layer has a thickness in the range of 500 to 2,000 Angstroms, this exposure will attack the silicon bonds of the platinum silicide and significantly weaken the mechanical structure of layer 19A.

The next step is to immerse wafer 11 in a liquid contained by a conventional ultrasonic generator tank 21; the liquid may be controllably agitated by acoustic energy from a conventional ultrasonic generator 22. As is known, acoustic energy applied in this manner places significant mechanical strains on the surface layers of an object and, in accordance with this feature of the invention, it removes the weakened disorganized film 19A on the surface of wafer 12. At this stage, the wafer has the appearance shown in FIG. 4. Notice that the platinum-silicide layer has been completely removed with no undercutting of front contacts 13'. Thus, the assembly is in condition for etching the silicon substrate 12 in a straightforward manner as is illustrated in FIG. 5.

Referring to FIG. 5, the exposed silicon is etched by subjecting it to a standard silicon etchant such as a 20:1 $HNO_3$:HF solution for a sufficient time to cause it to etch through to the back contact 14. There is of course some undercutting of the contacts 13' because the etching is substantially non-directional, and the upper portions of the substrate are exposed for a longer period of time than the lower portions. Nevertheless, because of the successful removal of platinum-silicide layer 19A, the undercutting is not serious and will not impair subsequent operation of the device.

Figure 3:
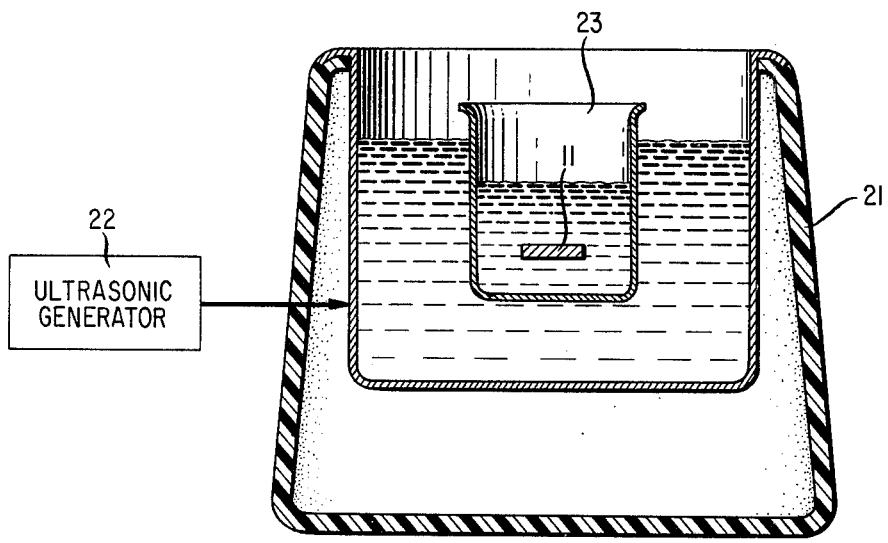
FIG. 3 is a schematic view of an ultrasonic generator and generator tank used in accordance with another step of the invention.

Having at this stage cut through to back contact 14, the next problem is to define the devices by severing layer 14. As mentioned before, a conventional method would be to mask and etch from the opposite side of back contact 14, but with small devices this would present registration problems. In accordance with another feature of the invention, the individual devices are defined by breaking the back contact 14 through the use again of the ultrasonic agitator of FIG. 3. First, the device array is removed from supporting disc 15 by dissolving the wax layer 16. The wax may be of a conventional type known as Apiezon which may be dissolved by immersing it in a known solvent such as A-20 KPR remover which removes the top KPR masking film and also dissolves the wax. Thereafter the array is cleaned in a rinse of trichloroethane, methanol, and acetone in a known manner. It is then placed once again in the ultrasonic generator tank 21 and subjected to acoustic agitation as described before. Assuming that the combined thickness of the gold film 14 and the platinum-silicide 19B is in the range of 2,000 angstroms to one micrometer (10,000 angstroms), the ultrasonic agitation will sever the film at all locations separating the devices, thereby leaving a multiplicity of individual devices.

For convenience, the wafer 11 is preferably located in a small glass beaker 23 within the ultrasonic generator tank 21 to facilitate collection of the individual devices after the film has been torn or ruptured as described above. As mentioned before, the invention is particularly convenient for defining devices of a small physical size. For example, the individual devices typically have diameters of between 1 and 10 mils with a semiconductor substrate thickness of 10 to 40 micrometers. The semiconductor member may typically be formed by epitaxial growth and subsequently reduced to its desired thickness in a known manner by first applying the gold contact layer 13 and then, using the layer 13 as a structural support, polishing the wafer 12 from the opposite side to its desired thickness.

The manner in which the contact layer 13 is applied will be described in more detail with reference to FIG. 6 which shows schematically a section of the semiconductor substrate 12. First, a layer of platinum is evaporated onto the silicon to a thickness of typically 600 to 700 angstroms. This layer is heated in a known manner so as to cause it to combine with the silicon in a known manner to form the platinum-silicide layer 19A having a thickness of about 1,200 to 1,400 angstroms. A layer 24 of titanium, typically of 300 angstroms thickness, is then evaporated onto the platinum-silicide layer. Next, as is known, a layer 25 of gold is evaporated onto the titanium to a thickness of typically 5,000 angstroms. Thereafter, the major portion of contact 13 is formed on layer 25 in a known manner by electroplating gold to a thickness of typically 3 micrometers. The gold back contact may be formed in a similar manner, except that, as described before, there is no electroplating of a gold layer, and the evaporated gold film of typically 5,000 to 7,000 angstroms thickness constitutes the back contact.

In the removal of the platinum-silicide film 19A, I have relied on empirical findings for removal which leaves the clean, dependable silicon surface shown in FIG. 4. I have found that sufficient structural weakening of platinum-silicide of a thickness of 600 angstroms requires an exposure to the silicon etch of approximately 50 seconds, while if platinum-silicide has a thickness of 2,000 angstroms, the exposure time should be approximately 70 to 75 seconds. Thereafter, the assembly is placed in the ultrasonic generator tank which, in the experiments conducted by me, was a commercially available tank known as Model No. 211T, L & R Manufacturing Company, Kearny, New Jersey. The ultrasonic generator was Model No. 210, L & R Manufacturing Company, Kearny, New Jersey. This generator has an intensity control which, for purposes of the film removal, was operated at about a medium intensity; and microscopic inspection showed that this procedure left a perfectly clean silicon surface as shown in FIG. 4. From these experiments it can be concluded that the layer 19A preferably has a thickness in the range of 500 – 2,000 angstroms.

The silicon used was of n-type conductivity and the devices eventually made were metal-semiconductor-metal or BARITT diodes, of the type described in the aforementioned Coleman et al. patent. If the silicon were of p-type conductivity, hafnium silicide or palladium-silicide would be favored as the contact metal, as is known in the art. With both alternatives, the same principle may be used for weakening the structure of the metal layer prior to its removal.

Likewise, silicon-containing metal alloys such as Au-Si are frequently used as a metal-semiconductor intermediate layer, and this may be removed by the same technique. Referring now to FIG. 7 there is shown a semiconductor having n, p and n regions 30, 31 and 32, respectively. A front contact is formed on layer 30 by first evaporating a layer 33 of gold-antimony to a thickness of about 1,000 angstroms. As is conventional practice, the mixture contains about 1 percent Sb and 99 percent Au. When appropriately heated, the evaporated layer forms a layer of gold-silicide (Au-Si) to a thickness of about 1,400 angstroms. A layer 34 of titanium is evaporated to a thickness of about 300 angstroms. A gold layer 35 having a thickness of 7,000 to 8,000 angstroms is then evaporated and the contact layer 36 is electroplated to a thickness of typically 3 micrometers. The back contact is formed by a gold-silicide layer 37, a titanium layer 38 and a gold layer 39.

The diodes are formed as described before; that is, the devices are first masked and etched to the gold-silicide layer 33. The gold-silicide is then exposed to the silicon etchant, which, as before, may be 20:1 HNO$_3$:HF. I have found experimentally that with a 1,000 angstrom layer of gold-silicide, an etch time of 60 seconds is sufficient, while with a gold-silicide layer thickness of 5,000 angstroms, an etch time of 105 seconds is appropriate for weakening the Au-Si structure without undercutting the front contacts. Thereafter, the weakened gold-silicide layer is removed in the ultrasonic generator tank. The semiconductor is then etched, and the gold film layer 39 is ruptured to separate the individual devices by ultrasonic agitation as before. In using the Model 210 ultrasonic generator, the intensity should be turned to a high level to rupture a gold film of about 7,000 – 8,000 angstroms. The completed devices may constitute n-p-n BARITT diodes having dimensions consistent with the dimension ranges given before.

The foregoing discussions have demonstrated how semiconductor devices, particularly microwave frequency BARITT diodes and IMPATT diodes, may simply and conveniently be cut into individual devices without impairing their operating characteristics. A technique has been described for effectively cutting through the silicon-containing metal intermediate layer that is inevitably needed in devices of this type and which poses a problem when extremely small devices are to be made. Another feature of the invention is used to avoid the need for etching the back contact with attendant problems of etch registration or the like. Rather, the back contact is made of appropriately thin metal film which may simply be ruptured through ultrasonic agitation.

Several examples of the silicon-containing intermediate metal layer have been given, and other such metals, such as aluminum-silicide eutectic alloy could alternatively be used. Gold is favored as the back contact metal film which holds the assembly together prior to final separation, but other metals, such as an aluminum film of appropriately small thickness could alternatively be used. No particular specifications as to acoustic intensity and the like have been given because commercially available equipment is used and appropriate intensities are easily determined empirically without undue experimentation.

Various other embodiments and modifications may be made by those skilled in the art without departing from the spirit and scope of the invention.

What is claimed is:

1. A process for making semiconductor devices comprising the steps of:
    forming a first thin metal layer on one side of a semiconductor wafer;
    forming a second metal layer on the opposite side of the semiconductor wafer;
    defining a plurality of devices by, first, etching part of the second metal layer, second, etching a corresponding part of the semiconductor wafer, third, immersing the wafer in a liquid, and fourth, subjecting the wafer to non-localized ultrasonic agitation of said liquid, said agitation being of sufficient intensity to rupture the first thin metal layer, thereby to break apart the defined devices.

2. The process of claim 1 wherein:
    the first metal layer has a thickness of approximately 2,000 to 10,000 angstroms.

3. The process of claim 2 wherein:
    the major part of the first metal layer comprises a layer of gold.

4. The process of claim 3 wherein:
    the semiconductor is silicon.

5. A process for making microwave devices comprising the steps of:
    forming a first, thin, metal contact comprised principally of gold and having a thickness less than about one micrometer on one side of a silicon wafer;
    forming a second metal contact comprised principally of gold and having a thickness greater than the first contact but less than about four micrometers on the opposite side of the silicon wafer;
    defining an array of devices each having a diameter between about one and ten mils by first, etching the second metal contact, second, etching a corresponding part of the silicon wafer, third, immersing the wafer in a liquid, and fourth, subjecting the wafer to non-localized ultrasonic agitation of said liquid, said agitation being of sufficient intensity to rupture the first thin metal contact thereby to break apart the defined devices.

* * * * *